United States Patent [19]
Sachdev

[11] Patent Number: 5,491,665
[45] Date of Patent: Feb. 13, 1996

[54] $I_{DDQ}$-TESTABLE RAM

[75] Inventor: Manoj Sachdev, Eindhoven, Netherlands

[73] Assignee: U.S. Philips Corporation, New York, N.Y.

[21] Appl. No.: 299,043

[22] Filed: Aug. 31, 1994

[30] Foreign Application Priority Data

Sep. 1, 1993 [EP] European Pat. Off. .............. 93202555

[51] Int. Cl.⁶ .................................................. G11C 13/00
[52] U.S. Cl. ...................................... 365/201; 365/189.01
[58] Field of Search ............................. 365/201, 189.01, 365/182, 230.01, 189.05

[56] References Cited

U.S. PATENT DOCUMENTS

| | | | |
|---|---|---|---|
| 5,351,213 | 9/1994 | Nakashima | 365/201 |
| 5,400,281 | 3/1995 | Morigami | 365/201 |

OTHER PUBLICATIONS

"A Current Testing for CMOS Static RAMs", By Hiroshi Yokoyama et al, Department of Information Engineering, Akita University, Akita City, Akita 010 Japan, 1993 IEEE.

"A New Testing Acceleration Chip for Low–Cost Memory Tests" M. Inoue et al IEEE Design & Test of Computers, Mar. 1993, pp. 15–19.

Intel Memory Products Data Handbook, 1992, pp. 3–320–3–323.

*Primary Examiner*—Terrell W. Fears
*Attorney, Agent, or Firm*—Steven R. Biren

[57] ABSTRACT

An electronic circuit includes an array of a number of memory cells that are functionally organized in rows and columns. The circuit includes test circuitry that is selectively operative to access all cells of the array in parallel. An $I_{DDQ}$-test then discovers whether or not there is a defect in any of the cells. This results in a test circuit which is faster, more efficient and more economical than previously-available circuits.

12 Claims, 3 Drawing Sheets

$I_{DDQ}$-TESTABLE RAM

FIELD OF THE INVENTION

The invention relates to electronic circuitry with a memory having a plurality of memory cells that are functionally organized in rows and columns.

BACKGROUND OF THE INVENTION

Systematic and automatic testing of electronic circuitry, and of integrated circuits in particular, becomes increasingly more important. Each next generation of circuits tends to develop ever higher component densities and an ever growing number of system functionalities. Individual circuits have become complicated to such an extent that process defects cannot be detected and located anymore safety exhaustive and expensive testing. Customers cannot be expected to accept circuitry products that show their hidden defects in operational use, thereby rendering, e.g., life support systems or aircraft control systems, unreliable. It is therefore of the utmost importance for both the manufacturer and the customer that tests are run to guarantee flawless operation of the circuit products.

Random access memories (SRAMs, DRAMs) are usually subjected to march tests and/or data retention tests. In a march test, a sequence of read and/or write operations are applied to every cell of the memory, either in increasing or decreasing address order. In data retention tests, every cell is written and checked after a pre-specified wait-time to see whether or not current leakage has occurred that has affected the stored logic state. Note that memory cells in a bit oriented memory and groups of memory cells in a word-oriented memory are accessible only successively, thus giving rise to lengthy test procedures.

Conventional testing of semiconductor memories that have a storage capacity in the order of 1 Mbit or larger makes up a considerable percentage of the production costs. For, e.g., a 4 Mbit DRAM this percentage well amounts to 10%. For larger memories, this percentage increases even further as the time required to conduct the test grows with extension of the storage capacity. For a 64 Mbit DRAM testing is estimated to cost 240 times as much as testing a 1 Mbit DRAM. This should imply that the ratio of the test cost and the total cost of a 64 Mbit DRAM then amounts to approximately 40%, which is unacceptably high. Accordingly, with increasing transistor densities and with increasing number of system functionalities that can be integrated on a semiconductor substrate (including wafer scale devices), prior an testing has become a major factor in determining the commercial viability of an IC memory product. For further information, see "A New Testing Acceleration Chip for Low-Cost Memory Tests", M. Inoue et at., IEEE Design & Test of Computers, March 1993, pp. 15–19.

Quiescent-current testing ($I_{DDQ}$-testing), also referred to as current supply monitoring method (CSM), of an integrated circuit aims at locating process defects in the circuit by monitoring the quiescent currents. The $I_{DDQ}$-testing technique has shown a lot of promise in the analysis of actual process defects in static CMOS ICs. The quiescent current, or steady state current, in a CMOS logic circuit should be very small, e.g., in the order of 1 µA. Any deviation is therefore easily detected. The potential of this testing technique is substantial in terms of cost reduction, and of quality and reliability enhancement.

Typical examples of defects occurring in ICs are stuck-at faults and gate oxide defects. Stuck-at faults are symptoms caused by unintended electrically conductive interconnections between circuit nodes and supply lines, thereby effecting a hard-wired pull-up or pull-down that interferes with the circuit's logic operation. A bridging fault formed by a conductive bridge of low resistance between a supply line and a signal line causes stuck-at phenomena. Impact of gate-oxide defects is often parametric in nature, i.e., not defined in terms of logic voltage levels, and is therefore not detected by conventional voltage methods. Gate-oxide defects may also give rise to stuck-at behaviour. Typically, $I_{DDQ}$-testing detects such faults.

However, certain classes of circuits conventionally are not $I_{DDQ}$-testable owing to their specific configuration. DRAMs are an example of one such a class. If there is a defect in a DRAM's memory cell, such as in the gate oxide, the charge stored at the cell's capacitor leaks away. Therefore, in a quiescent state a current does not flow and, accordingly, is essentially not detectable through $I_{DDQ}$-measurements. At present, such defects are detected either by aforementioned conventional march tests or tedious data retention tests, depending on the type of faults expected. Although SRAMs can be subjected to $I_{DDQ}$-testing, it is not an attractive option owing to the costs, as the SRAM cells are only individually accessible.

SUMMARY OF THE INVENTION

It is an object of the invention to provide a means to test memories in general, and DRAMs and SPAMs in particular, by $I_{DDQ}$ measurements. It is another object to reduce costs involved in testing semiconductor random access memories by $I_{DDQ}$- and/or voltage methods.

To this end, the invention provides an electronic circuit with a memory having a plurality of memory cells that are functionally organized in rows and columns. The invention is characterized, in that the circuit comprises test means being selectively operative to access in parallel a given number of two or more memory cells of at least a particular one of the columns, substantially without causing hot-electron injection or Fowler-Nordheim tunneling in at least faultless ones among the memory cells.

Normally, only one bit cell per column is accessed to retrieve or store data in the conventional way. In normal memory operation, accessing two (or more) cells of the same column in parallel would imply inefficient duplication when storing data and annihilation when retrieving data. In the invention, the memory is put into a test mode, wherein two or more cells of at least a particular one of the columns are accessed in parallel. That is, these cells are rendered simultaneously accessible by interconnecting them in parallel. Accordingly, if the cells are subjected to a quiescent non-zero voltage and if any cell shows a defect that manifests itself through current leakage, then this is detectable through an $I_{DDQ}$-measurement conducted on all cells arranged in parallel. Note that some sort of parallel access occurs in a flash EEPROM during an erasure operation. This, however, serves a completely different purpose than that of $I_{DDQ}$-testing, and involves Fowler-Nordheim tunneling or hot-electron injection. For further details on Flash memories, see, e.g., Intel, Memory Products Data Handbook, 1992, pp. 3-320–3-323.

An example of a defect that is discoverable in this manner is a short circuit between data retention nodes, e.g., the capacitor of a DRAM cell or the interconnections of the cross-coupled inverters in an SRAM cell, and a supply line. Another example of such a defect is a faulty gate oxide of a FET capacitor in a DRAM cell. Both examples fall into the category of data retention faults that show up as a current leak.

Preferably, the test means are operative to access in parallel the cells of a plurality of columns or all cells of all columns in parallel. In this manner, it is easily detected whether or not there is a faulty cell in a specific memory segment comprised of the plurality of columns or in the integral memory, respectively.

The test means can be operative to first access in parallel all memory cells of all columns of the memory and, if thereby causing a current through the memory larger than a predetermined threshold, to then access in parallel all cells of fewer than all columns. If the presence of a faulty cell is thus detected, and if it is desirable to locate the defect, then the columns and rows of the examined segment or memory can thereupon be scanned according to an efficient search procedure, e.g., by successively halving the memory area to be probed until the defect's position is sufficiently accurately known. This procedure can be used to functionally eliminate faulty cells, e.g., by replacing a column comprising such defect by a spare column under control of the $I_{DDQ}$-test results, given the fact that the memory is provided with redundancy features.

In a typical random access memory, the cells in a row are all connected to a word line, and the cells in a columns are connected to single bit line, such as in a DRAM with a single cell per bit, or between a bit line and a bit-bar line, such as in an SRAM or in a DRAM with a dual-cell per bit. In the invention, the test means are operative to activate all or specific ones of said word lines connected to the given number of cells of the particular one of the columns, and to drive a particular one of the bit lines, which is associated with the particular column, by a quiescent voltage.

Suppose that in the test mode all bit cells of all columns of a single-cell-per-bit DRAM are connected in parallel. This is accomplished by activating all word lines. Now, driving all bit lines with a logic high, e.g., a supply voltage $V_{DD}$ of, say, 3.3 Volts via the conventional bit line drivers or pre-charging logic, results in a high voltage of 3.3 Volts over each and every cell. If there is a current leak, then this is spotted in the $I_{DDQ}$ measurements. Driving bit lines of adjacent columns with complementary logic voltages permits detection of short circuits between the bit lines via $I_{DDQ}$ measurements. Some DRAMs are provided with dual cells that store complementary logic states in a pair of complimentarily charged capacitors, together forming a single bit of information. Driving the bit lines and the bit-bar lines with $V_{DD}$ then discovers defects caused by leakage currents to ground, and driving the bit lines and bit-bar lines with GND allows of discovering defects caused by leakage currents to $V_{DD}$.

A similar procedure can be applied to SRAMs. Each column in an SRAM comprises a pair of bit lines, called bit line and bit-bar line. An SRAM cell is connected to the bit line and to the bit-bar line. Driving all bit lines high and all bit-bar lines low, the cells all being connected in parallel by having them simultaneously accessed, permits checking stuck-at defects and data retention defects relating to a first logic state of the cells. Driving all bit-bar lines high and all bit lines low, while the cells are all connected in parallel, permits checking stuck-at defects and data retention defects relating to a second logic state of the cells.

The concept of the invention can be implemented in a variety of ways. For example, all word lines are disconnected from the row decoder and are driven high, i.e., enabled, in the test mode, e.g., by pass-transistors. Alternatively, pan of the word lines or single ones of the word lines may be enabled in the test mode in order to detect and also to locate a possible failure. The bit lines and bit-bar lines can be driven high or low by using the pre-charge logic or the bit line drivers. The test means can simply be a sequential machine generating two codes, in addition to a code for the memory's normal operation mode, so that the bit lines and bit-bar lines can be driven high as well as low from the pre-charge logic.

A method in accordance with the invention may be applied to conventional memories, i.e., those without the test means physically integrated with the memory. To this end, appropriate probes can be located to contact the word lines, bit lines and memory supply lines to supply them with the required voltages to carry out the $I_{DDQ}$-test. However, this requires as an additional step accurate positioning of the probes, thereby introducing an additional source of errors and delay. It is therefore to be preferred to have the test means physically integrated with the electronic circuit, either on each chip or on the wafer as a test feature shared by all circuitry on the wafer.

The invention is particularly relevant to DRAMs and SRAMs. The invention, i.e., connecting in parallel elements of a structured array in order to conduct tests, is also applicable to testing CCD (charge coupled device) memories and LCDs (liquid crystal displays). CCDs are serial memories wherein amounts of electric charge are serially shifted through a sequence of potential wells, i.e., memory cells, created under clock signal control and typically arranged in a two-dimensional matrix. Applying patterns of stationary control signals instead of dynamic clock signals renders the CCD testable, e.g., through $I_{DDQ}$ measurements, at least as far as the integrity of the clock lines is concerned. An LCD typically comprises a two-dimensional array of crystals (cells), whose optical states are individually controllable by supplying appropriate control voltages via a grid of conductors. Note that the LCD's crystals in normal operation are driven by time-dependent control signals in order not to damage the crystals. Applying patterns of test time-dependent voltages to the grid and measuring the associated time-averaged currents provides an indication of whether or not there are defective cells.

The invention is extendable to other kinds of electronic circuitry, typically those having an array structure. For example, an organization of random accessible or sequentially accessible processing elements or stations interconnected via a shared bus could be $I_{DDQ}$-tested similarly by connecting them in parallel in a test mode.

BRIEF DESCRIPTION OF THE DRAWING

The invention is explained hereinafter by way of example and with reference to the accompanying drawing, wherein.

Throughout the drawing, similar or corresponding features are indicated with the same reference numerals.

DESCRIPTION OF THE PREFERRED EMBODIMENTS

Random access read/write semiconductor memories can be divided basically in two categories, namely SRAMs and DRAMs. The term "SRAM" stands for static random access memory and refers to a memory in which the data content is retained in the absence of control signals, provided its power supply remains energized. Typically, an SRAM cell comprises a bistable circuit, such as a pair of cross-coupled logic inverters. A logic high is stored by having a first one of the inverters providing a logic high and the other a logic low, whereas a logic low is stored by having the other one of the inverters providing a logic high and the first one a logic low. The term DRAM stand for dynamic random access memory and refers to a memory in which the memory cells require repetitive application of control signals (refresh signals) in order to retain the data stored. This repetitive control operation is known as a "refresh cycle". Typically, a DRAM cell comprises a capacitor to store a single bit of information as an amount of electrical charge. A logic high is represented by an amount of charge exceeding a pre-specified threshold, and a logic low is represented by an amount of charge smaller than the threshold. Alternatively, a DRAM may be comprised of dual cells that store complementary logic states in a pair of complimentarily charged capacitors, together forming a single bit of information.

DRAM cell

Figure 1:
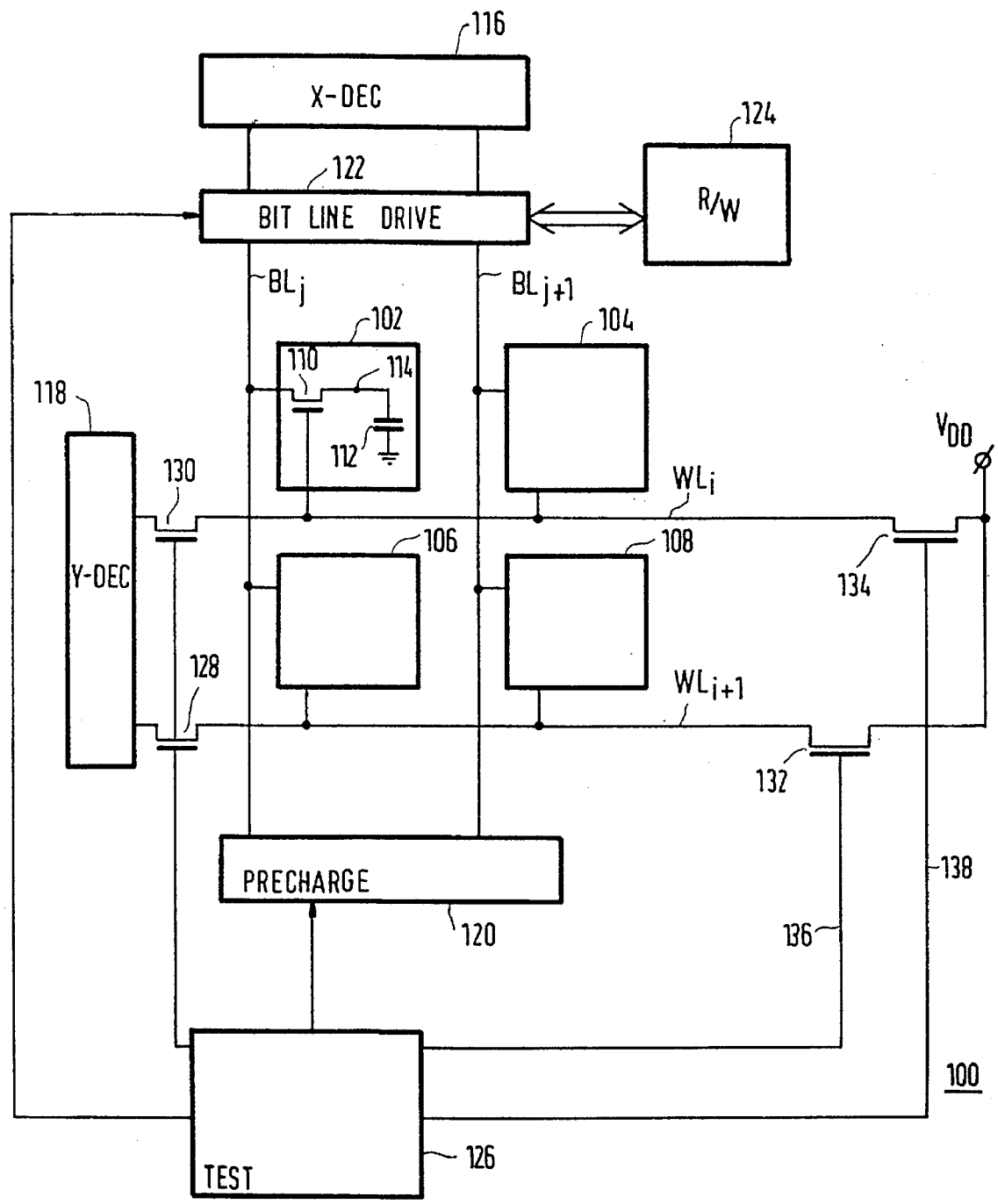
FIG. 1 is a diagram of a circuit with a DRAM in accordance with the invention.

FIG. 1 gives a diagram of DRAM 100. DRAM 100 comprises a plurality of uniform bit cells, of which only cells 102, 104, 106 and 108 are indicated explicitly. The cells are functionally organized in rows and columns. The cells of rows i and i+1 are connected to word lines $WL_i$ and $WL_{i+1}$, respectively. The cells of columns j and j+1 are connected to bit lines $BL_j$ and $BL_{j+1}$, respectively. Since the cells are uniform, only cell 102 is discussed in further detail. Cell 102 is located in row i and in column j. Cell 102 includes an access transistor 110 that has a current channel connected to bit line $BL_j$ and that has a control electrode connected to word line $WL_i$. Cell 102 further includes a capacitor 112 that is connected between the current channel of transistor 110 via a node 114 and a $V_{SS}$ supply line, commonly referred to as "plate". A single bit of information is stored in cell 102 as an amount of electrical charge in capacitor 112. A logic high is represented by a charge exceeding a pre-specified threshold and a logic low is represented by a charge below the threshold.

DRAM 100 further includes an X decoder 116, an Y decoder 118, pre-charging logic 120, bit line drivers 122 and read/write circuitry 124. Since decoders 116 and 118, pre-charging logic 120, bit line drivers 122 and read/write circuitry 124 are all well known conventional parts of a DRAM, neither the implementation of these parts nor their conventional operation need be discussed here in further detail.

DRAM 100 also comprises features to permit $I_{DDQ}$-testing of the memory. A test control block 126 is operative in the test mode to turn off transistors 128–130 arranged between the word lines, among which $WL_i$ and $WL_{i+1}$, and Y decoder 118, and to turn on transistors 132–134 arranged between the word lines and a power supply node carrying $V_{DD}$. This causes all cells 102, 104, 106 and 108 to be connected to their respective bit lines. Further, test control block 126 is operative to drive the bit lines, among which are $BL_j$ and $BL_{j+1}$, for example via pre-charging logic 120 or via bit line drivers 122. For instance, the bit lines are all driven to 3.3 Volts. This causes all cells to be connected in parallel, namely, between $V_{DD}$ and ground. Any defect that gives rise to current leakage in any cell is revealed through current measurements in the $I_{DDQ}$-test, e.g., by measuring the current drawn from the supply nodes of the shown circuit. In fact, all cells are scanned simultaneously, thus realizing a highly efficient quality check. In FIG. 1, transistors 132–134 can be made individually controllable by test control block 126 via individual control lines 136 and 138, respectively. This permits not only detecting the presence but also the location of a fault. Alternatively, transistors 132–134 may be turned on and turned off simultaneously by a single control line (not shown here). The latter embodiment then requires less substrate area for the control lines to control transistors 132–134.

Figure 2:
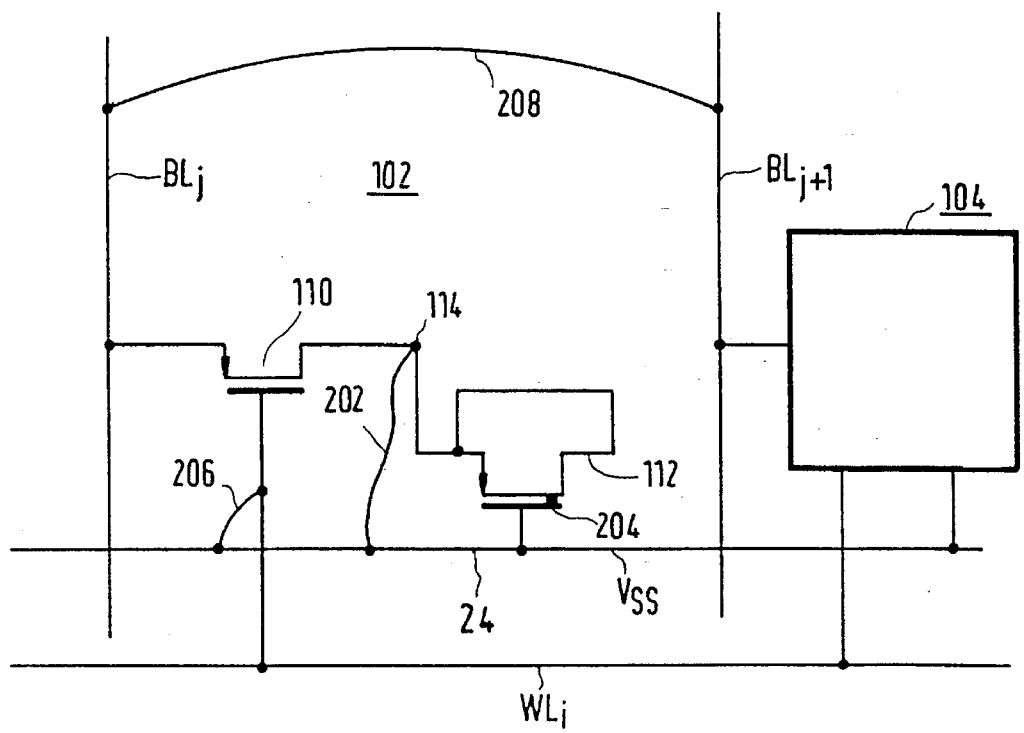
FIG. 2 is a diagram of a typical DRAM cell to illustrate defects.

Turning now to FIG. 2, cell 102 may be faulty in a variety of ways. A first defect that can occur is a short-circuit 202 from node 114 to $V_{SS}$ supply line 24. A second fault could be a gate oxide defect 204 bridging the gate oxide of transistor 112 that is connected as capacitor. Defects 202 and 204 can cause memory cell 102 to have either a stuck-at-0 fault or a data retention fault, depending on the resistance of the defect. These defects are conventionally detected by monitoring a Write/Read operation or a data retention test. However, assume that cell 102 has a gate oxide defect 204, which causes charge to leak slowly away to $V_{SS}$. If a logic 1 is written and read in quick succession, and if the resistance is high enough, the read operation can be successful in finding the same logic value as was written. Therefore, defect 204 need not be discovered using conventional test procedures. A quiescent current measurement traditionally conducted is not able to detect fault 204 either, since leakage current in this case flows only or a short time. This is due to the fact that the capacitance of capacitor 112 is very small, typically in the order of 50 fF for the multi-Mbit memories, and accordingly holds very little charge. This defect is detected by the conventional data retention test. In the invention, however, the $I_{DDQ}$ test scans all statically activated cells in parallel to discover this defect. A third possible defect is a short-circuit 206 from word line $WL_i$ to the $V_{SS}$ supply line. This defect prevents access transistor 110 from being turned on, thereby permanently disabling memory cell 102. The $I_{DDQ}$ measurements in the invention scan all cells in parallel and also detect this type of defect as it gives rise to a relatively large current. A fourth possible fault is a short circuit 208 between adjacent bit lines, which is likely to occur in large capacity DRAMs whose cells are extremely small, typically in the order of 1.5 $\mu m^2$, and therefore have a small column pitch. This defect 208 is readily detected in an $I_{DDQ}$-test according to the invention by having adjacent bit lines supplied with supply voltage $V_{DD}$ and $V_{SS}$ alternately. Above examples may serve to illustrate the powerful test capability of a DRAM provided with test means according to the invention.

Figure 3:
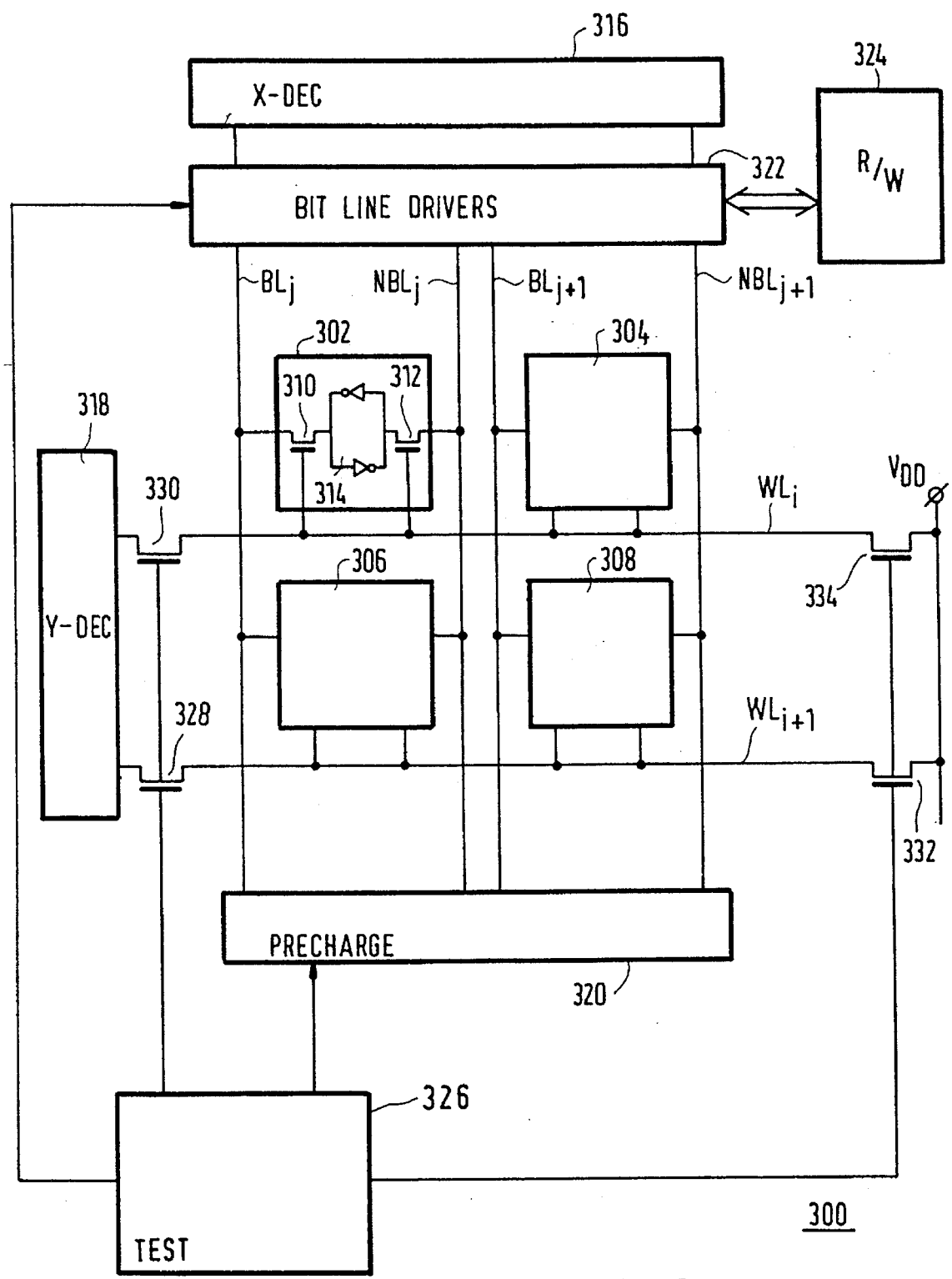
FIG. 3 is a diagram of a circuit with an SRAM in accordance with the invention.

FIG. 3 illustrates an SRAM 300. SRAM 300 comprises a plurality of uniform bit cells, of which only cells 302, 304, 306 and 308 are indicated explicitly. The cells are functionally organized in rows and columns. The cells of rows i and i+1 are connected to word lines $WL_i$ and $WL_{i+1}$, respectively. The cells of columns j and j+1 are connected to bit line $BL_j$ and bit-bar line $NBL_j$, and bit line $BL_{j+1}$, and bit-bar line $NBL_{j+1}$, respectively. Since the cells are uniform, only cell 302 is discussed in further detail. Cell 302 is located in row i and in column j. Cell 302 includes a first access transistor 310 that has a current channel connected to bit line $BL_j$ and that has a control electrode connected to word line WL$_i$, a second access transistor 312 that has a current channel connected to bit-bar line NBL$_j$ and that has a control electrode also connected to word line WL$_i$, and a latch 314 connected between the current channels of first and second access transistors 310 and 312. Latch 314 comprises two cross-coupled inverters arranged between supply voltage nodes (not shown). A single bit of information is stored in cell 302 as one of two stable states of latch 314.

SRAM 300 further includes an X decoder 316, an Y decoder 318, pre-charging logic 320, bit line drivers 322 and read/write circuitry 324. Since decoders 316 and 318, pre-charging logic 320, bit line drivers 322 and read/write circuitry 324 are all well known conventional parts of an SRAM, neither the implementation of these parts nor their conventional operation need be discussed here in further detail.

SRAM 300 also comprises features to permit $I_{DDQ}$-testing of the memory. A test control block 326 is operative in the test mode to turn off transistors 328–330 arranged between the word lines, among which WL$_i$ and WL$_{i+1}$, and Y decoder 318, and to turn on transistors 332–334 arranged between the word lines and a power supply node carrying $V_{DD}$. This causes all cells 302, 304, 306 and 308 to be connected to their respective bit lines and bit-bar lines. Further, test control block 326 is operative to drive the bit lines and bit-bar lines, among which are BL$_j$, NBL$_j$, BL$_{j+1}$ and NBL$_{j+1}$, for example via pre-charging logic 320 or via bit line drivers 322. For instance, the bit lines are all driven to 3.3 Volts and the bit-bar lines are grounded. This causes all cells to be connected in parallel, namely, between $V_{DD}$ and ground. Any defect that gives rise to current leakage in any cell in a first logic state is revealed through current measurements in the $I_{DDQ}$-test, e.g., by measuring the current drawn from the supply nodes of the shown circuit. The bit-bar lines thereupon are all driven to 3.3 Volts and the bit lines are grounded. This provides a check for current leakage in the second logic state of each cell. In fact, all cells are scanned simultaneously, thus realizing a highly efficient quality check of the SRAM.

Figure 4:
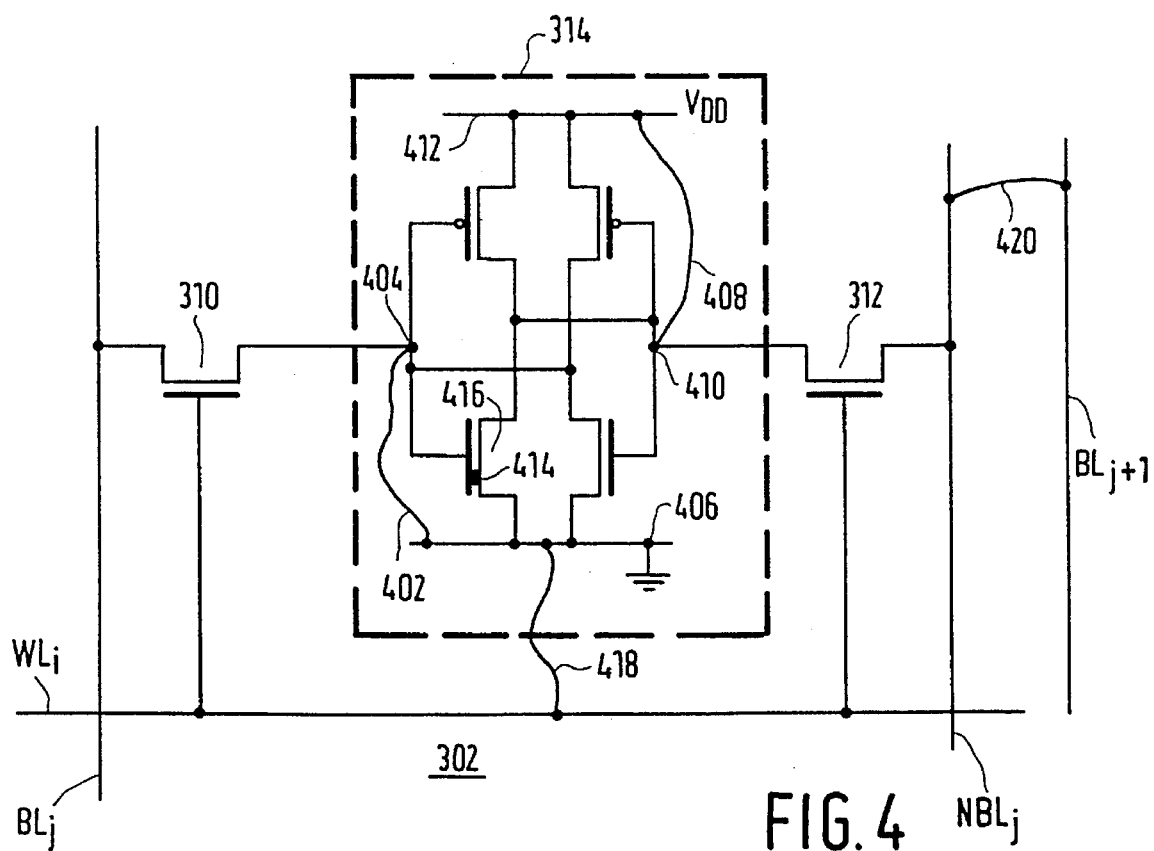
FIG. 4 is a diagram of a typical SRAM cell to illustrate defects.

Turning now to FIG. 4, showing SRAM cell 302 in further detail. Cell 302 may be faulty in a variety of ways. A first type of defect that can occur is a short-circuit 402 from a node 404 to $V_{SS}$ supply line 406 or a short circuit 408 from a node 410 to $V_{DD}$ supply line 412. A second fault could be a gate oxide defect 414 bridging the gate oxide of a transistor 416 that is a functional part of one of the inverters of latch 314. Defects 402, 408 and 414 can cause memory cell 302 to have either a stuck-at fault or a data retention fault, depending on the resistance of the defect. These defects are conventionally detected by monitoring a Write/Read operation or a data retention test. However, assume that cell 302 has a gate oxide defect 414, which causes a current leakage to $V_{SS}$. If a logic 1 is written and read in quick succession, and if the resistance is high enough, the read operation can be successful in finding the same logic value as was written. Therefore, defect 414 need not be discovered using conventional test procedures. A quiescent current measurement traditionally conducted on SRAM 300 is able to detect fault 414. However, cells in a traditional SRAM are only sequentially accessible which implies a lengthy procedure to be carried out. In the invention, the $I_{DDQ}$ test scans all activated cells in parallel to discover this defect. A third possible defect is a short-circuit 418 from word line WL$_i$ to the $V_{SS}$ supply line. This defect prevents access transistors 310 and 312 from being turned on, thereby permanently disabling memory cell 102. The $I_{DDQ}$ measurements in the invention scan all cells in parallel and also detect this type of defect as it gives rise to a relatively large current. A fourth possible fault is a short circuit 420 between bit-bar line NBL$_j$ and bit line BL$_{j+1}$, which is likely to occur in large capacity SRAMs whose cells are extremely small, typically in the order of 25 μm$^2$, and therefore have a small column pitch. This defect 420 is readily detected in an $I_{DDQ}$-test according to the invention by having these adjacent lines supplied with supply voltage $V_{DD}$ and $V_{SS}$ alternately. Above examples may serve to illustrate the powerful test capability of an SRAM provided with test means according to the invention as all cells can be scanned in parallel.

I claim:

1. Electronic circuitry with a memory having a plurality of memory cells functionally organized in rows and columns, characterized in that the circuitry comprises test circuitry for selectively operative to connect and access simultaneously and in parallel a selected number of at least two memory cells of at least a particular one of the columns to simultaneously test said memory cells, at least nondefective ones of said memory cells not having hot-electron injection or Fowler-Nordheim tunneling induced during testing.

2. The circuitry of claim 1, wherein the test circuitry is operative to access simultaneously and in parallel all cells of a plurality of columns.

3. The circuitry of claim 2, wherein the test circuitry is operative to access simultaneously and all cells of the memory in parallel.

4. The circuitry of claim 1, wherein the memory comprises a random access memory.

5. The circuitry of claim 4, wherein the random access memory includes a DRAM.

6. The circuitry of claim 4, wherein the random access memory includes an SRAM.

7. The circuitry of claim 1, wherein the memory comprises a CCD memory.

8. The circuitry of claim 1, wherein the memory comprises an LCD.

9. The circuit of claim 1, wherein the memory includes a wafer scale circuit.

10. The circuit of claim 1, wherein the test means are operative to first access in parallel all memory cells of all columns of the memory and, if this causes a current through the memory larger than a predetermined threshold, to then access in parallel all cells of fewer than all columns.

11. The circuit of claim 1, wherein:

the cells in a respective one of the rows are connected to a respective word line;

the cells in a respective one of the columns are connected to a respective bit line; and the test circuitry is operative to activate at least specific ones of said word lines connected to the given number of cells of the particular one of the columns, and to drive a particular one of the bit lines, which is associated with the particular column, by a quiescent voltage.

12. The circuit of claim 11, wherein the memory comprises:

row decoding means coupled to the respective word lines for selecting a specific one of the rows upon reception of a row address associated with the specific one of the rows;

column decoding means coupled to the respective bit lines for selecting at least a specific one of the columns upon reception of a column address associated with the specific one of the columns;

bit line driver means coupled between the column decoding means and the columns to selectively drive the bit lines;

pre-charging means coupled to the respective bit lines for pre-charging the respective bit lines;

and wherein the test circuitry comprises:

first switch means between the word lines and the row decoding means for disconnecting the word lines from the row decoding means;

second switch means between the word lines and a supply voltage node for connecting the word lines to the supply voltage node; and control means for control of at least the pre-charging means or the bit line drivers to drive the bit line at least of the particular column.

* * * * *